US011437369B2

(12) United States Patent
Hwang et al.

(10) Patent No.: US 11,437,369 B2
(45) Date of Patent: Sep. 6, 2022

(54) ARRAY OF MULTI-STACK NANOSHEET STRUCTURES

(71) Applicant: SAMSUNG ELECTRONICS CO., LTD., Suwon-si (KR)

(72) Inventors: Inchan Hwang, Schenectady, NY (US); Hwichan Jun, Clifton Park, NY (US)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 25 days.

(21) Appl. No.: 17/147,587

(22) Filed: Jan. 13, 2021

(65) Prior Publication Data

US 2022/0108981 A1    Apr. 7, 2022

Related U.S. Application Data

(60) Provisional application No. 63/086,766, filed on Oct. 2, 2020.

(51) Int. Cl.
*H01L 27/085* (2006.01)
*H01L 29/423* (2006.01)
*H01L 21/8234* (2006.01)
*H01L 21/822* (2006.01)

(52) U.S. Cl.
CPC ........ *H01L 27/085* (2013.01); *H01L 21/8221* (2013.01); *H01L 21/823475* (2013.01); *H01L 21/823481* (2013.01)

(58) Field of Classification Search
CPC . H01L 27/085; H01L 27/0826; H01L 27/088; H01L 27/0922; H01L 29/0847; H01L 29/42392
USPC .................................................. 257/241, 287
See application file for complete search history.

(56) References Cited

U.S. PATENT DOCUMENTS

| 10,043,796 | B2 | 8/2018 | Machkaoutsan et al. |
| 10,707,304 | B2 | 7/2020 | Reznicek et al. |
| 2019/0172828 | A1 | 6/2019 | Smith et al. |
| 2020/0075574 | A1 | 3/2020 | Smith et al. |
| 2020/0118892 | A1 | 4/2020 | Cheng et al. |
| 2020/0219970 | A1 | 7/2020 | Mannebach et al. |
| 2020/0219978 | A1 | 7/2020 | Guler et al. |
| 2020/0294969 | A1* | 9/2020 | Rachmady ............ H01L 27/088 |

* cited by examiner

*Primary Examiner* — Hoai V Pham
(74) *Attorney, Agent, or Firm* — Sughrue Mion, PLLC

(57) ABSTRACT

An array of multi-stack transistor structures is provided, wherein the multi-stack transistor structures are arranged in a plurality of rows and a plurality of columns in the array, wherein each of the multi-stack transistor structures includes two or more vertically arranged transistor stacks, and wherein a dam structure is formed between adjacent two rows in a same column so that a multi-stack transistor structure in one of the adjacent two rows is electrically isolated from a multi-stack transistor structure in the other of the adjacent two rows in the same column.

9 Claims, 11 Drawing Sheets

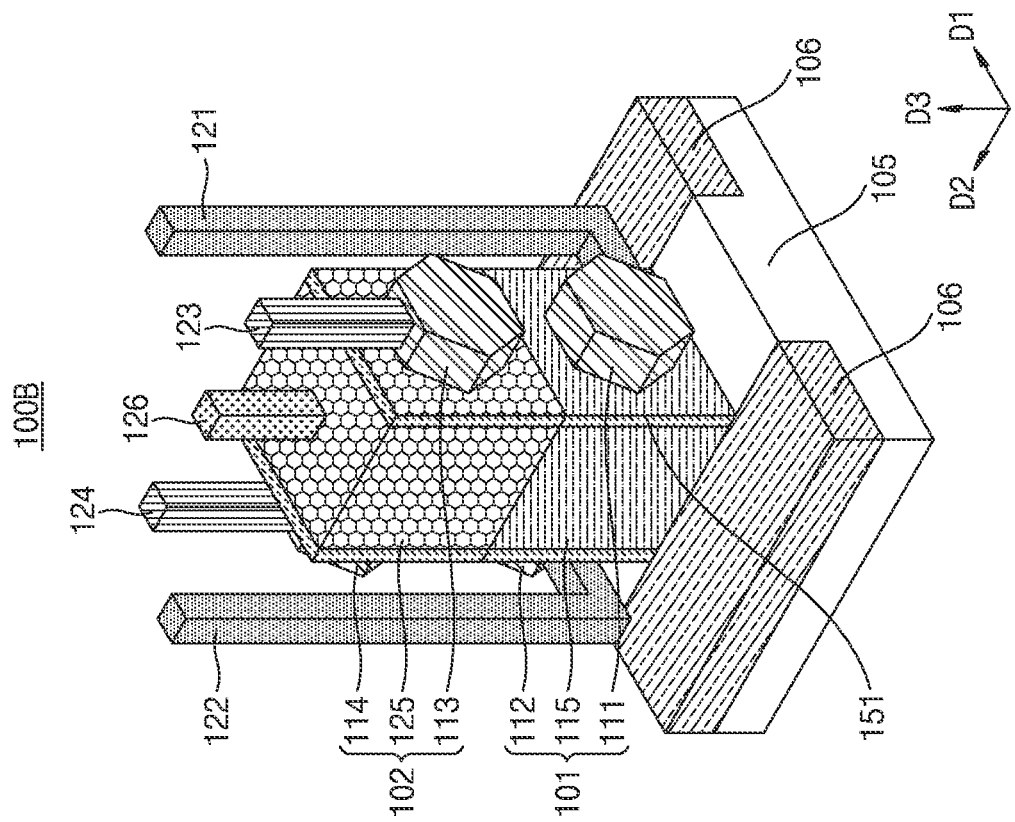
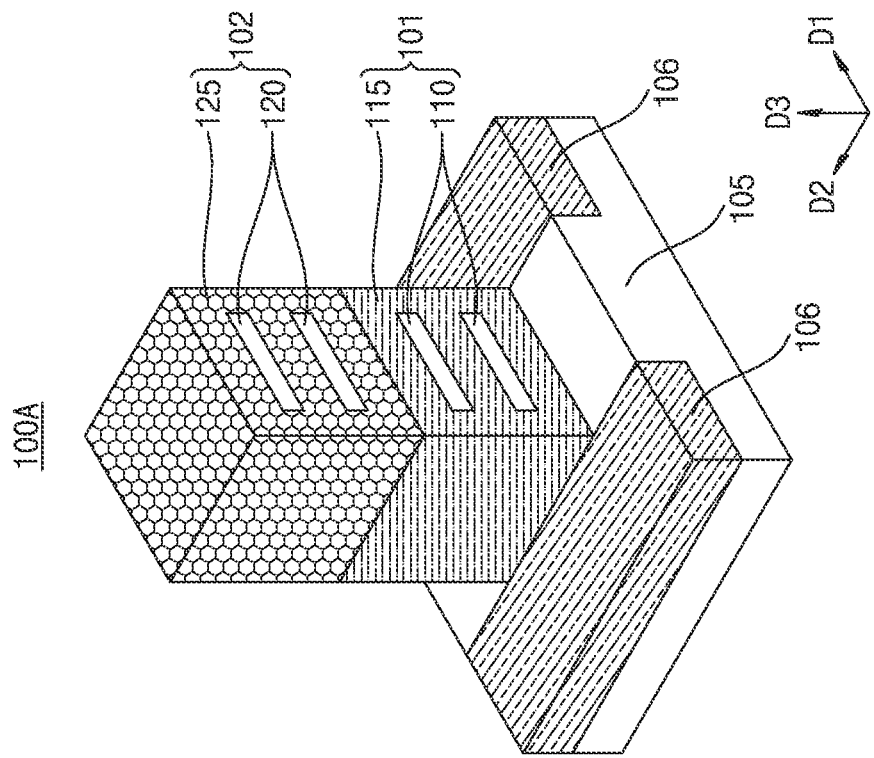

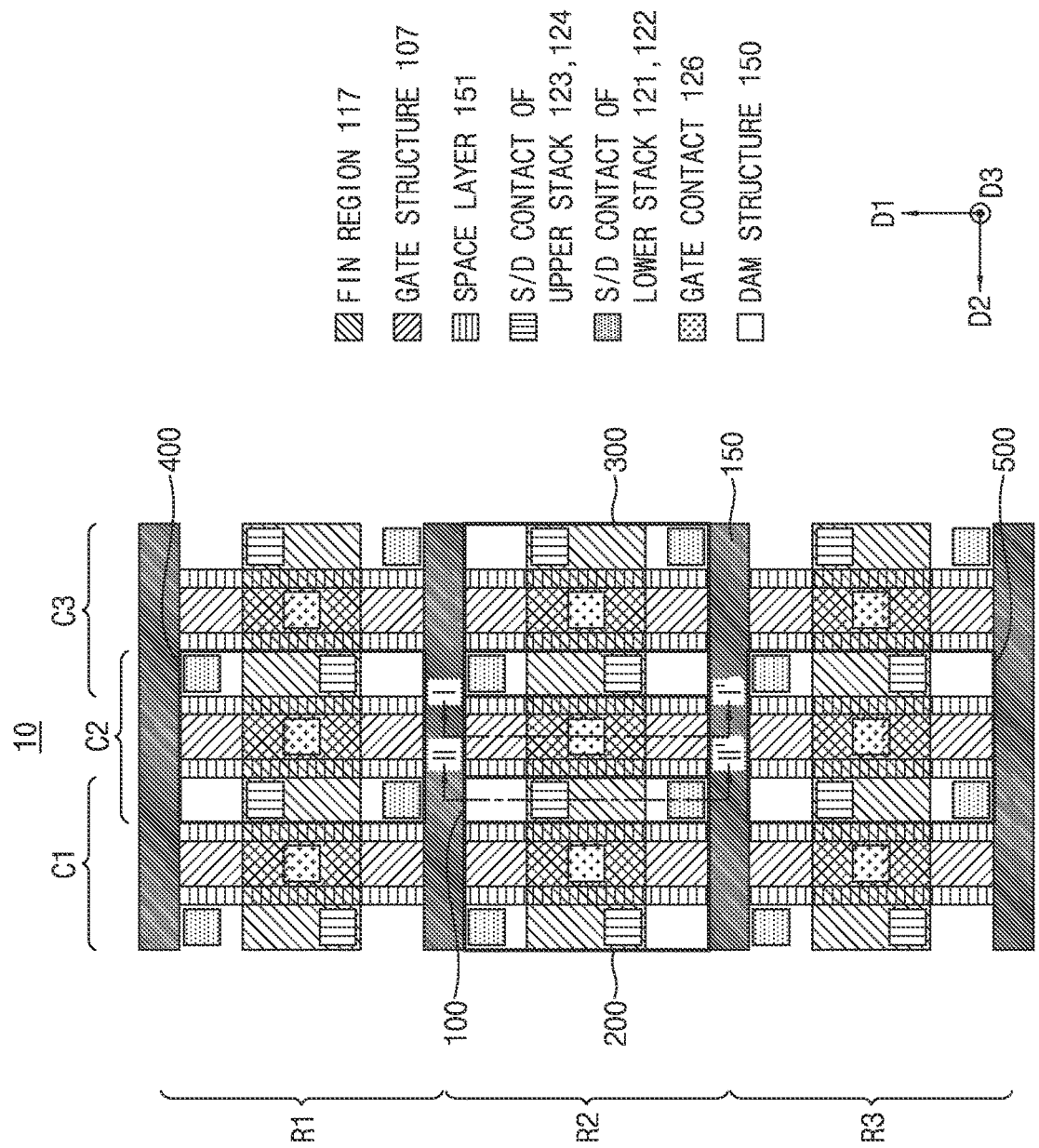

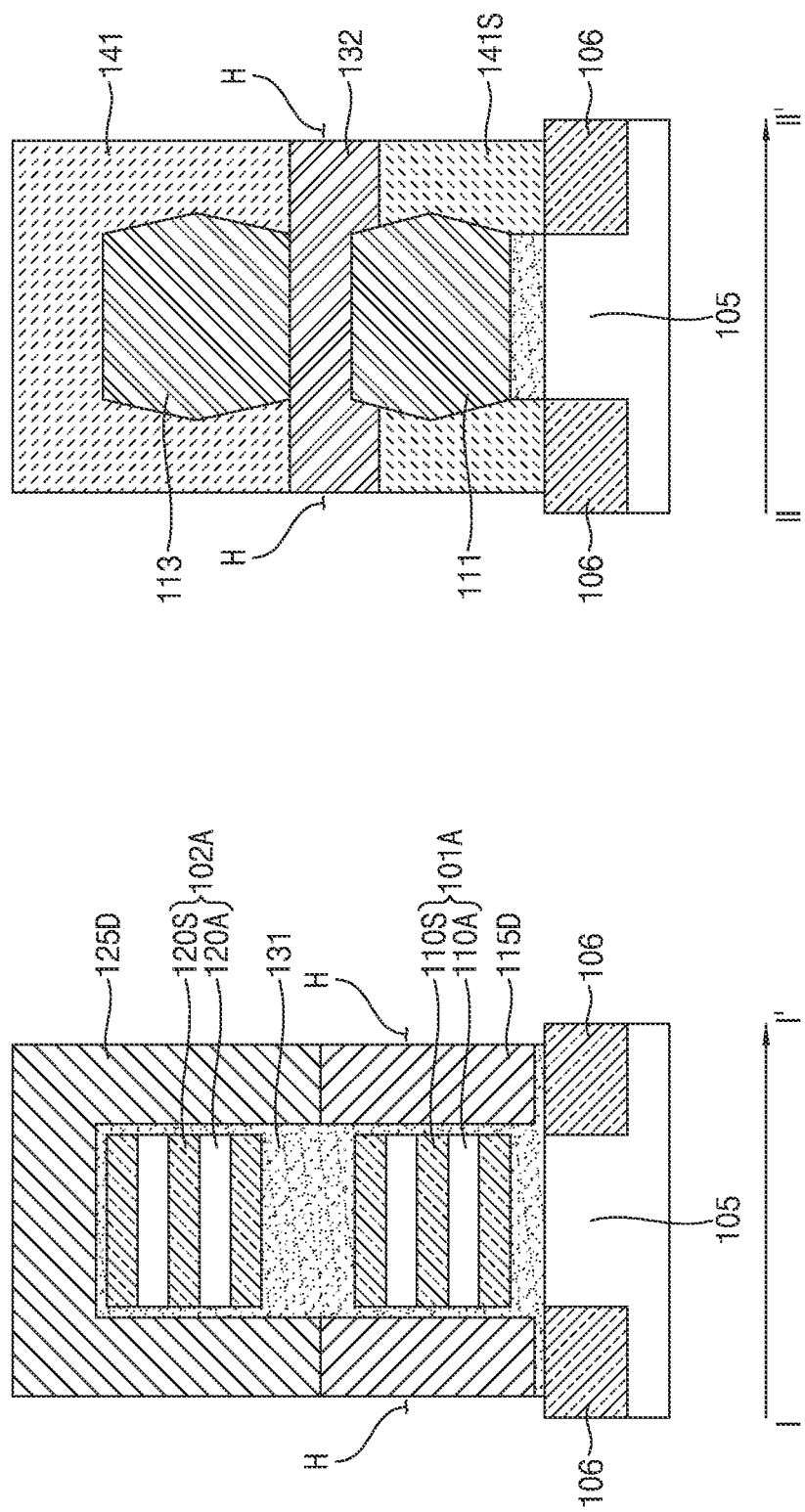

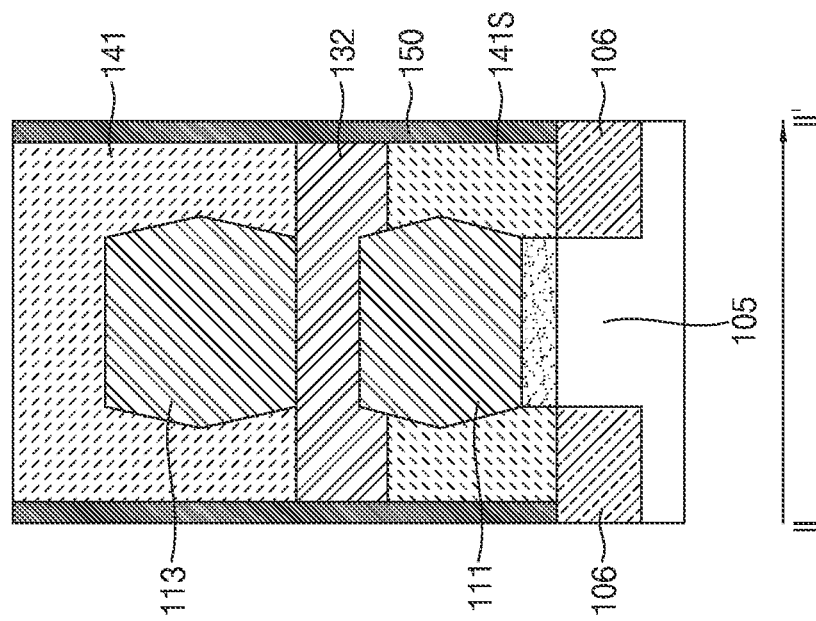
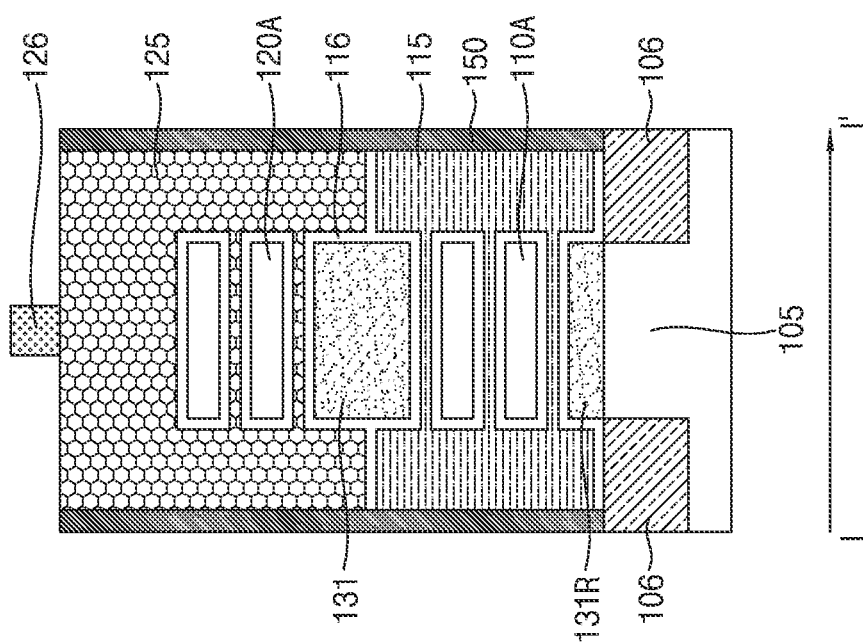
FIG. 6A
FIG. 6B

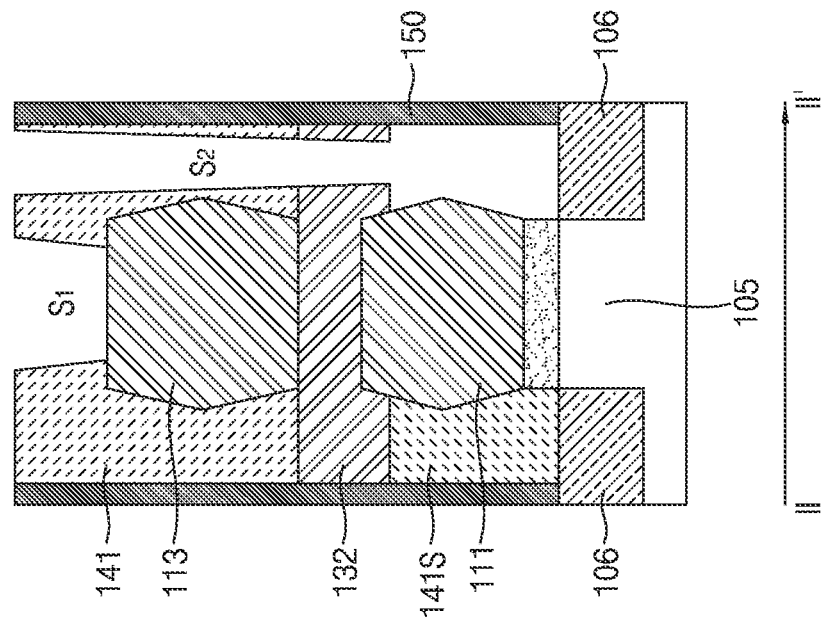
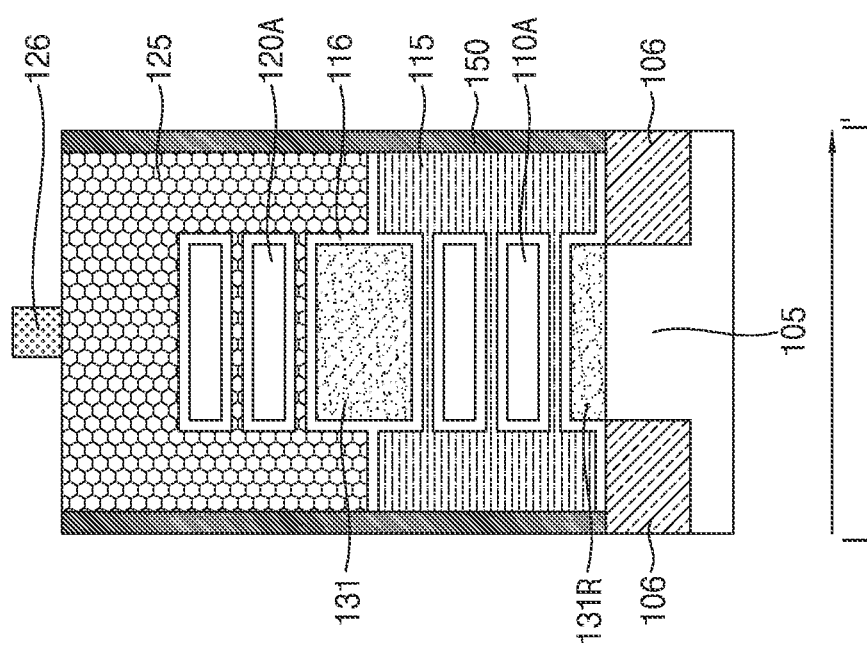

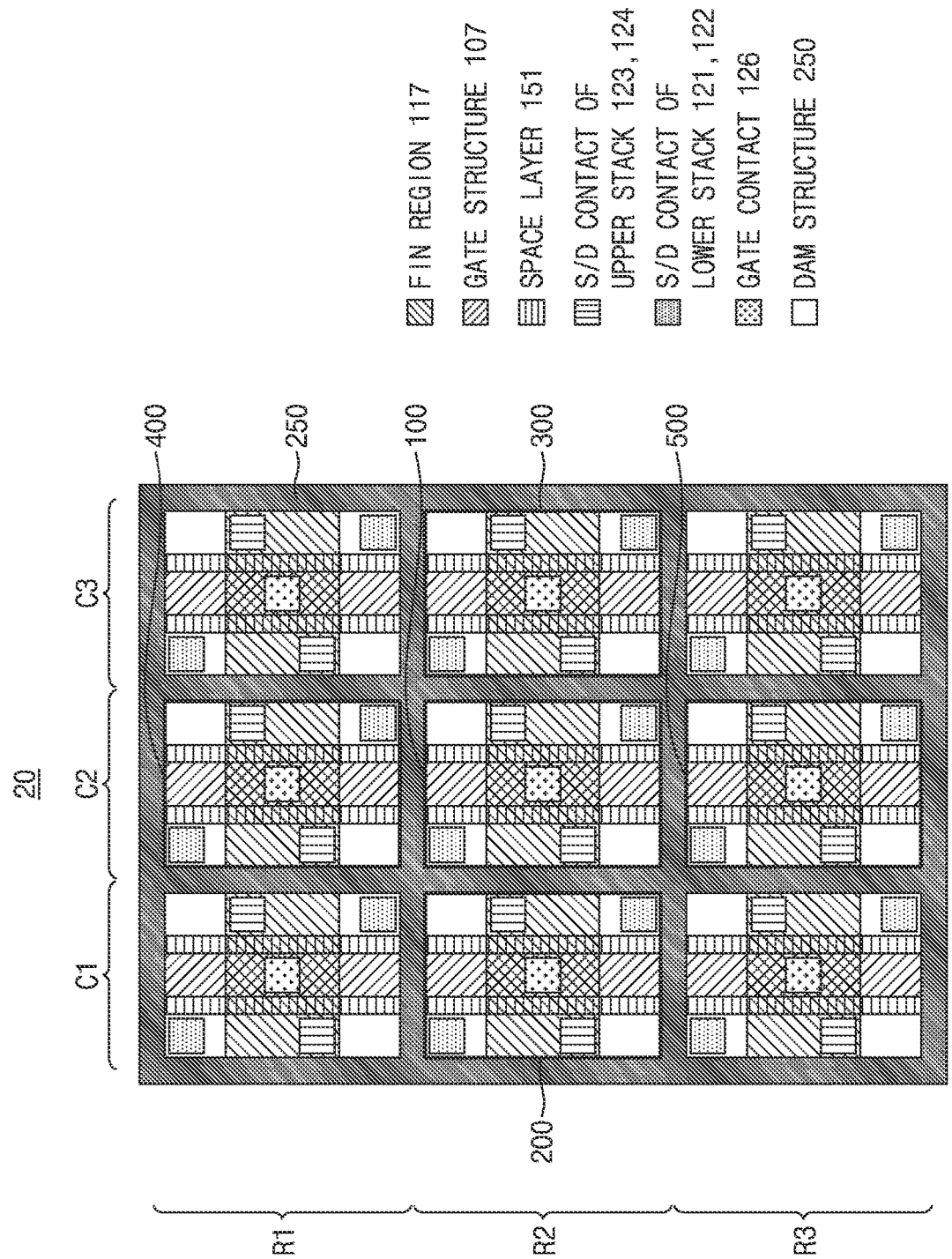

ARRAY OF MULTI-STACK NANOSHEET STRUCTURES

CROSS-REFERENCE TO THE RELATED APPLICATION

This application is based on and claims priority from U.S. Provisional Application No. 63/086,766 filed on Oct. 2, 2020 in the U.S. Patent and Trademark Office, the disclosure of which is incorporated herein in its entirety by reference.

BACKGROUND

1. Field

Apparatuses and methods consistent with example embodiments of the inventive concept relate to an array of multi-stack transistor structures each of which comprises two or more transistor stacks.

2. Description of the Related Art

Unlike conventional planar field effect transistors (FETs), fin field-effect transistors (finFET) and nanosheet transistors are characterized by gate-all-around (GAA) structures to achieve an improved control of current flow through their channel structures surrounded by a gate as well as a greater device density gain.

However, the existing process of manufacturing high density transistors may not be suitable for manufacturing the nanosheet transistors.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

The disclosure provides an array of multi-stack transistor structures with a dam structure formed in an early step of manufacturing the multi-stack transistor structures.

According to an embodiment, there is provided an array of multi-stack transistor structures is provided, wherein the multi-stack transistor structures are arranged in a plurality of rows and a plurality of columns in the array, wherein each of the multi-stack transistor structures includes two or more vertically arranged transistor stacks, and wherein a dam structure is formed between adjacent two rows in a same column so that a multi-stack transistor structure in one of the adjacent two rows is electrically isolated from a multi-stack transistor structure in the other of the adjacent two rows in the same column.

According to an embodiment, there is provide an array of multi-stack transistor structures, wherein the multi-stack transistor structures are arranged in a plurality of rows and a plurality of columns in the array, wherein each of the multi-stack transistor structures includes two or more vertically arranged transistor stacks, and wherein a dam structure is formed between adjacent two rows in a same column and adjacent two columns in a same row so that a multi-stack transistor structure in one of the adjacent two rows is electrically isolated from a multi-stack transistor structure in the other of the adjacent two rows in the same column, and a multi-stack transistor structure in one of the adjacent two columns is electrically isolated from a multi-stack transistor structure in another of the adjacent two columns in the same row.

According to an embodiment, there is provided a method of manufacturing an array of multi-stack transistor structures. The method may include: providing the multi-stack transistor structures arranged in a plurality of rows and a plurality of columns in the array, each of the multi-stack transistor structures including a $1^{st}$ transistor stack and a $2^{nd}$ transistor stack formed above the $1^{st}$ transistor stack; performing gate-cut patterning along a plurality of $1^{st}$ lines dividing the multi-stack transistor structures by row to form a plurality of $1^{st}$ trenches; forming a dam structure in the $1^{st}$ trenches to isolate multi-stack transistor structures in one row from multi-stack transistor structures in an adjacent row in the array; and after the forming the dam structure, forming at least a $1^{st}$ source/drain contact structure landing on a $1^{st}$ source/drain region of the $1^{st}$ transistor stack of each of the multi-stack transistor structures.

Due to the dam structure included in the array of multi-stack transistor structures according to the above embodiments, it may be possible to increase the yields of multi-stack transistor structures preventing an electrical short circuit between the multi-stack transistor structures.

BRIEF DESCRIPTION OF THE DRAWINGS

Example embodiments of the inventive concept will be more clearly understood from the following detailed description taken in conjunction with the accompanying drawings in which:

FIG. 1A illustrates a perspective view of a multi-stack nanosheet structure, according to an embodiment;

FIG. 1B illustrates a perspective view of a multi-stack nanosheet structure of FIG. 1A on which source/drain regions and source/drain contact structures formed, according to an embodiment;

FIG. 2 illustrates a top plan view of an array of multi-stack nanosheet structures divided by row, according to an embodiment;

FIGS. 3A and 3B to FIGS. 8A and 8B illustrate a method of manufacturing an array of multi-stack nanosheet structures, according to embodiments;

FIG. 9 illustrates a top plan view of an array of multi-stack nanosheet structures divided by row and column, according to an embodiment;

DETAILED DESCRIPTION OF THE EMBODIMENTS

Figure 3B:
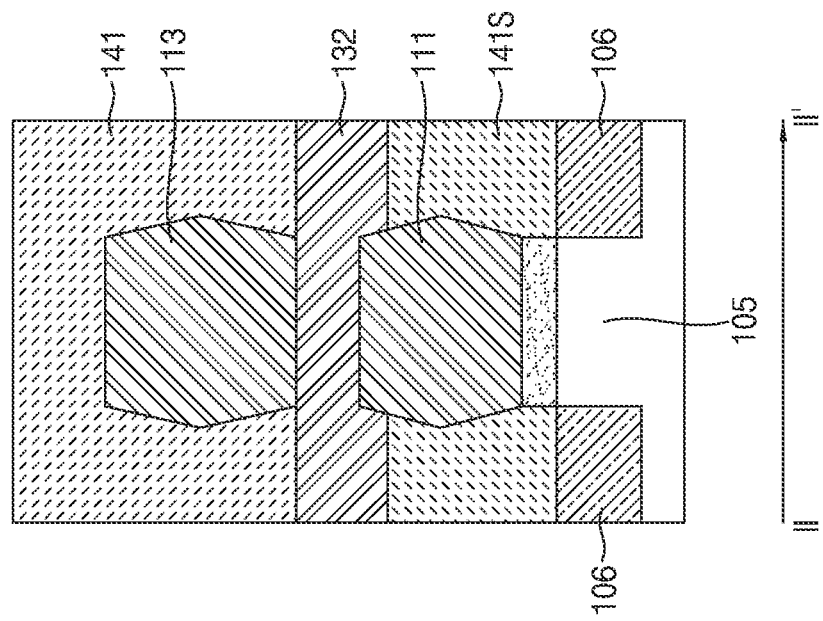

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. In addition, terms such as a "row" and a "column" of an array, in which a plurality of semiconductor structures are arranged, may be interpreted as a "column" and a "row" when the array is rotated 90 degrees.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, although in an embodiment of manufacturing an inventive apparatus or structure, a step or operation is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including nanosheet transistors may or may not be described in detail herein.

FIG. 1A illustrates a perspective view of a multi-stack nanosheet structure, according to an embodiment.

A multi-stack nanosheet structure 100 shown in FIG. 1A includes a $1^{st}$ nanosheet stack 101 and a $2^{nd}$ nanosheet stack 102 vertically stacked on a substrate 105 in this order in a D3 direction, according to an embodiment. The $1^{st}$ nanosheet stack 101 includes a plurality of $1^{st}$ nanosheet layers 110 as channel for current flow in the $1^{st}$ nanosheet stack 101, and the $2^{nd}$ nanosheet stack 102 includes a plurality of $2^{nd}$ nanosheet layers 120 as channel for current flow in the $2^{nd}$ nanosheet stack 102. The $1^{st}$ and $2^{nd}$ nanosheet layers 110 and 120 may be grown by epitaxy based on a substrate 105 formed of, for example, silicon (Si).

The $1^{st}$ and $2^{nd}$ nanosheet layers 110 and 120 are completely surrounded by $1^{st}$ and a $2^{nd}$ gate structures 115 and 125, respectively, except at their open ends formed at two opposite sides of the $1^{st}$ and $2^{nd}$ gate structures 115 and 125 where source/drain regions are to be grown to complete the multi-stack nanosheet structure 100 as two nanosheet transistors. In FIG. 1A, source/drain regions are intentionally omitted from the $1^{st}$ and $2^{nd}$ nanosheet stacks 101 and 102 to show how the $1^{st}$ and $2^{nd}$ nanosheet layers 110 and 120 take a form of respectively penetrating the $1^{st}$ and $2^{nd}$ gate structures 115 and 125 in a D2 direction which is a channel length direction of the $1^{st}$ and $2^{nd}$ nanosheet stacks 101 and 102.

The $1^{st}$ and $2^{nd}$ gate structures 115 and 125 may be formed of a conductor metal such as tungsten (W) or aluminum (Al), not being limited thereto. The $1^{st}$ and $2^{nd}$ gate structures 115 and 125 may also have different work function materials or characteristics depending on the type of nanosheet transistor to be formed from the $1^{st}$ and $2^{nd}$ nanosheet stacks 101 an 102.

This multi-stack nanosheet structure 100 is provided to achieve an even greater device density gain than a single nanosheet structure in a semiconductor device, according to an embodiment.

FIG. 1B illustrates a perspective view of a multi-stack nanosheet structure of FIG. 1A on which source/drain regions and source/drain contact structures are formed, according to an embodiment.

Referring to FIG. 1B, a multi-stack nanosheet structure 100B includes the same $1^{st}$ and $2^{nd}$ nanosheet stacks 101 and 102 of FIG. 1A, and thus, duplicate descriptions thereof are omitted herein. However, the multi-stack nanosheet structure 100B further includes source/drain regions 111 to 114 and source/drain contact structures 121 to 124 for the $1^{st}$ and $2^{nd}$ nanosheet stacks 101 and 102 to constitute two nanosheet transistors as shown in FIG. 1B, according to an embodiment.

The $1^{st}$ and $2^{nd}$ source/drain regions 111 and 112 may be epitaxially grown from the $1^{st}$ nanosheet layers 110, and the $3^{rd}$ and $4^{th}$ source/drain regions 113 and 114 may also be epitaxially grown from the $2^{nd}$ nanosheet layers 120. The source/drain regions 111 to 114 may include Si or a Si compound doped with n-type dopants (e.g., phosphorus or arsenic) or p-type dopants (e.g., boron or gallium) depending on the type of nanosheet transistor to be formed from the $1^{st}$ and $2^{nd}$ nanosheet stacks 101 and 102. The source/drain regions 111 to 114 will be respectively connected to power sources or other circuit elements (not shown) for internal routing through the $1^{st}$ to $4^{th}$ source/drain contact structures 121 to 124, which may be formed of a conductor metal material such as cobalt (Co), tungsten (W), ruthenium (Ru), or a combination thereof, not being limited thereto.

The multi-stack nanosheet structure 100B also includes a gate contact structure 126 formed on the $2^{nd}$ gate structure 125 to receive a gate input signal for at least the $2^{nd}$ gate structure 125. According to an embodiment, the $1^{st}$ and $2^{nd}$ gate structures 115 and 125 may be connected to each other to receive a common gate input signal through the gate contact structure 126. The gate contact structure 126 may be formed of the same material forming the $1^{st}$ to $4^{th}$ source/drain contact structures 121 to 124.

FIG. 1B further shows that a spacer layer 151 is formed on two opposite surfaces of the $1^{st}$ and $2^{nd}$ gate structures 115 and 125 where the $1^{st}$ to $4^{th}$ source/drain regions 111 to 114 are formed. The spacer layer 151 is provided to reduce occurrence of capacitance between the $1^{st}$ and $2^{nd}$ gate structure 115 and 125 and the $1^{st}$ to $4^{th}$ source/drain regions 111 to 114. The spacer layer 151 may be formed of silicon nitride (SiN) and/or at least one low permittivity dielectric material such as, for example, silicon boron carbide nitride (SiBCN).

In the multi-stack nanosheet structure 100B, the $3^{rd}$ and $4^{th}$ source/drain regions 113 and 114 of the $2^{nd}$ nanosheet stack 102 may vertically overlap the $1^{st}$ and $2^{nd}$ source/drain regions 111 and 112 of the $1^{st}$ nanosheet stack 101, respectively. In this case, the $1^{st}$ and $2^{nd}$ source/drain contact structures 121 and 122 connected to upper metal patterns (not shown), to which the $3^{rd}$ and $4^{th}$ source/drain contact structures 123 and 124 are also connected, may not be directly extended downward to be respectively connected to the $1^{st}$ an $2^{nd}$ source/drain regions 111 and 112 of the $1^{st}$ nanosheet stack 101 because of the $3^{rd}$ and $4^{th}$ source/drain regions 113 and 114 of the $2^{nd}$ nanosheet stack 102 vertically overlapping the $1^{st}$ and $2^{nd}$ source/drain regions 111 and 112 of the $1^{st}$ nanosheet stack 101, respectively. Thus, when the $3^{rd}$ and $4^{th}$ source/drain contact structure 123 and 124 are respectively connected to top surfaces of the $3^{rd}$ and $4^{th}$ source/drain regions 113 and 114 of the $2^{nd}$ nanosheet stack 102, the $1^{st}$ and $2^{nd}$ source/drain contact structure 121 and 122 may not be connected to top surfaces of the $1^{st}$ and $2^{nd}$ source/drain regions 111 and 112 of the $1^{st}$ nanosheet stack 101, respectively. In order to address this problem, the $1^{st}$ and $2^{nd}$ source/drain contact structure 121 and 122 may be bent to make a lateral contact on side surfaces of the $1^{st}$ and $2^{nd}$ source/drain regions 111 and 112 of the $1^{st}$ nanosheet stack 101, respectively, as shown in FIG. 1B, according to an embodiment.

A single multi-stack nanosheet structure such as the above multi-stack nanosheet structure 100 having the $1^{st}$ and $2^{nd}$ nanosheet stacks 101 and 102 is obtained by manufacturing an array of a plurality of multi-stack nanosheet structures as described below.

FIG. 2 illustrates a top plan view of an array of multi-stack nanosheet structures divided by row, according to an embodiment.

An array of multi-stack nanosheet structures 10 shown in FIG. 2 includes a plurality of multi-stack nanosheet structures divided into $1^{st}$ to $3^{rd}$ rows R1 to R3 by a dam structure 150 according to an embodiment. For example, the $2^{nd}$ row R2 includes $2^{nd}$, $1^{st}$ and $3^{rd}$ multi-stack nanosheet structures 200, 100 and 300 arranged in this order the D2 direction, which is a channel length direction, on a substrate 105 (not shown) in the array 10. The array 10 also shows the multi-stack nanosheet structures have $1^{st}$ to $3^{rd}$ columns C1 to C3. For example, the $2^{nd}$ column C2 includes $4^{th}$, $1^{st}$ and $5^{th}$ multi-stack nanosheet structures 400, 100 and 500 arranged in this order in a D1 direction, which is a channel width direction, on the substrate 105.

The number of rows and columns in the array 10 and the number of multi-stack nanosheet structures included in a single row and a single column of the array 10 are not limited to three as above, and thus, the array 10 may provide a different number of rows and columns of multi-stack nanosheet structures, and a different umber of multi-stack nanosheet structures in a single row and a single column. However, the number of the multi-stack nanosheet structures in each row may be the same, and the number of the multi-stack nanosheet structure may be the same, according to an embodiment.

Referring back to FIG. 2, the array 10 shows a gate structure 107 extended in the channel width direction in each of the $1^{st}$ to $3^{rd}$ columns C1 to C3, and a fin region 117 extended in the channel length direction in each of the $1^{st}$ to $3^{rd}$ rows R1 to R3. FIG. 2 also shows that the spacer layer 151 is formed on both sides of the gate structure 107 where source/drain regions are to be formed.

Each of the multi-stack nanosheet structures in the array 10 including the multi-stack nanosheet structures 100 to 500 will have a same structure as the multi-stack nanosheet structure 100 shown in FIG. 1B, and thus, duplicate descriptions may not be provided herebelow.

The gate structure 107 corresponding to each multi-stack nanosheet structure includes upper and lower gate structures of upper and lower nanosheet stacks. For example, the gate structure 107 corresponding to the multi-stack nanosheet structure 100 in the $2^{nd}$ row R2 and the $2^{nd}$ column C2 of the array 10 includes the $1^{st}$ and $2^{nd}$ gate structures 115 and 125. The fin region 117 below the gate structure 107 (not shown) corresponding to each multi-stack nanosheet structure includes nanosheet layers of upper and lower nanosheet stacks. For example, the fin region 117 below the gate structure 107 corresponding to the multi-stack nanosheet structure 100 in the $2^{nd}$ row R2 and the $2^{nd}$ column C2 of the array 10 includes the $1^{st}$ and $2^{nd}$ nanosheet layers 110 and 120 surrounded by the $1^{st}$ and $2^{nd}$ gate structures 115 and 125, respectively.

In the fin region 117 outside the gate structure 107 and the spacer layer 151, source/drain regions are to be formed for each of lower and upper nanosheet stacks of each multi-stack nanosheet structures. For example, in the fin region 117 corresponding to the multi-stack nanosheet structure 100 in the $2^{nd}$ row R2 and the $2^{nd}$ column C2 of the array 10, the $1^{st}$ to $4^{th}$ source/drain regions 111 to 114 of the $1^{st}$ and $2^{nd}$ nanosheet stacks 101 and 102 of the multi-stack nanosheet structure 100 are to be formed. These source/drain regions including the source/drain regions 111 to 114 are not shown in FIG. 2 for brevity.

Also in the fin region 117 outside the gate structure 107, source/drain contact structures vertically land on top surfaces of the source/drain regions of the upper nanosheet stacks. For example, in the fin region 117 corresponding to the multi-stack nanosheet structure 100 in the $2^{nd}$ row R2 and the $2^{nd}$ column C2 of the array 10, the $3^{rd}$ and $4^{th}$ source/drain contact structures 123 and 124 vertically landing on the top surfaces of the $3^{rd}$ and $4^{th}$ source/drain regions 113 and 114 are shown.

FIG. 2 further shows that source/drain contact structures of the lower nanosheet stacks laterally landing on side surfaces of the source/drain regions of the lower nanosheet stacks. These source/drain contact structure are shown in outside the gate structure 107 and the fin region 117 in FIG. 2 because the source/drain regions of the lower nanosheet stacks are vertically overlapped by the source/drain regions of the upper nanosheet stacks, and thus, source/drain contact structures extended from upper metal patterns (not shown) cannot land on the top surfaces of these source/drain regions of the lower nanosheet stacks. For example, the $1^{st}$ and $2^{nd}$ source/drain contact structures 121 and 122 laterally landing on the side surfaces of the $1^{st}$ and $2^{nd}$ source/drain regions 111 and 112 are shown in outside the gate structure 107 and the fin region 117 of the multi-stack nanosheet structure 100 in the $2^{nd}$ row R2 and the $2^{nd}$ column.

In addition, FIG. 2 shows that a gate contact structure 126 is formed on the gate structure 107 for each of the multi-stack nanosheet structures to receive a gate input signal for the multi-stack nanosheet structure.

According to an embodiment, the dam structure 150 which divides the multi-stack nanosheet structures in the array 10 by row is extended vertically down to the substrate 105. This dam structure 150 is formed in the middle of a process of manufacturing the array 10, and before a wet etching process is performed to form the $1^{st}$ and $2^{nd}$ source/drain contact structures 121 and 122 laterally contacting the side surfaces of the $1^{st}$ and $2^{nd}$ source/drain regions 111 and 113, respectively. This is because a wet etchant used for the wet etching process may spread into a region of at least one of the adjacent $4^{th}$ and $5^{th}$ multi-stack nanosheet structure 400 and 500 arranged above and below thereof, respectively, in the array 10. If the wet etchant spreads into the region of the adjacent $4^{th}$ or $5^{th}$ multi-stack nanosheet structure 400 or 500, an opening formed by the wet etching will be connected to this region, and $1^{st}$ or $2^{nd}$ source/drain contact structure 121 or 122 may also be connected to this region, thereby causing an electrical short pass between the $1^{st}$ multi-stack nanosheet structure 100 and the $4^{th}$ or $5^{th}$ multi-stack nanosheet structure. However, if the dam structure 150 is formed as shown in FIG. 2, the dam structure 150 may prevent the wet etchant from spreading into this region, thereby preventing the possible electrical short pass.

The dam structure 250 may include an insulating material such as silicon oxide ($SiO_x$) or silicon nitride ($SiN_x$), not being limited thereto, according to embodiments.

Meanwhile, the $1^{st}$ multi-stack nanosheet structure 100 shares the $1^{st}$ and $3^{rd}$ source/drain regions and the $1^{st}$ and $3^{rd}$ source/drain contact structures with the $2^{nd}$ multi-stack nanosheet structure 200 arranged on its left in the $2^{nd}$ row R2. Further, the $1^{st}$ multi-stack nanosheet structure 100 shares the $2^{nd}$ and $4^{th}$ source/drain regions and the $2^{nd}$ and $4^{th}$ source/drain contact structures with the $3^{rd}$ multi-stack nanosheet structure 300 arranged on its right in the $2^{nd}$ row R2. Thus, the dam structure 150 may not be necessary to isolate the $1^{st}$ multi-stack nanosheet structure 100 from the $2^{nd}$ and $3^{rd}$ multi-stack nanosheet structures adjacent to the $1^{st}$ multi-stack nanosheet structure 100 in the same row.

FIGS. 3A and 3B to FIGS. 8A and 8B illustrate a method of manufacturing an array of multi-stack nanosheet structures, according to embodiments.

It is understood that although FIGS. 3A and 3B to FIGS. 8A and 8B depict a process of manufacturing a single multi-stack nanosheet structure, the process may be performed at the same time on all of the multi-stack nanosheet structures in the array 10 as a whole. The multi-stack nanosheet structures shown in FIGS. 3A and 3B to FIGS. 8A and 8B may include the same elements of the multi-stack nanosheet structure 100 described above in reference to FIGS. 1A, 1B and 2, and thus, duplicate descriptions will be omitted herebelow.

FIGS. 3A and 3B to FIGS. 8A and 8B illustrate two cross-sectional views of a multi-stack nanosheet structure included in an array of a plurality of multi-stack nanosheet structures before this array is completed as the array 10 of the multi-stack nanosheet structures shown in FIG. 2, according to an embodiment. These cross-sectional views of FIGS. 3A and 3B to FIGS. 8A and 8B are taken along lines I-I' and II-II' on the multi-stack nanosheet structure in the array corresponding to lines I-I' and II-II' drawn on the $1^{st}$ multi-stack nanosheet structure 100 in the $2^{nd}$ row R2 and the $2^{nd}$ column C2 in the array 10 of FIG. 2.

Figure 3A:
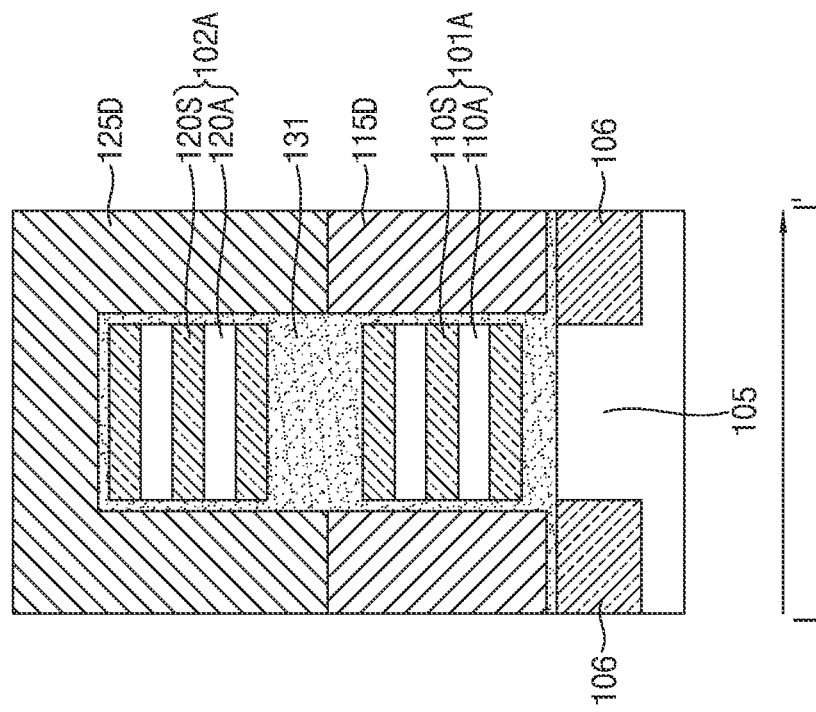

Referring to FIG. 3A, a multi-stack nanosheet structure includes $1^{st}$ and $2^{nd}$ nanosheet stacks 101A and 102A sequentially stacked on the substrate 105 with an isolation layer 131 therebetween. The multi-stack nanosheet structure shown in FIG. 3A is a preliminary multi-stack nanosheet structure before being completed as the multi-stack nanosheet structure 100B of FIG. 2

The isolation layer 131 covers all flanks of the $1^{st}$ and $2^{nd}$ nanosheet stacks 101A and 102A. The $1^{st}$ nanosheet stack 101A includes three $1^{st}$ sacrificial nanosheet layers 110S and two $1^{st}$ nanosheet layers 110A formed alternatingly above the substrate 105, and the $2^{nd}$ nanosheet stack 102A includes three $2^{nd}$ sacrificial nanosheet layers 120S and two $2^{nd}$ nanosheet layers 120A formed alternatingly above the $1^{st}$ nanosheet stack 101A.

Although FIG. 3A shows that the $1^{st}$ and $2^{nd}$ nanosheet stacks 101A and 102A each have only two nanosheet layers and three sacrificial nanosheet layers, the number of the nanosheet layers and the sacrificial nanosheet layers in each of the $1^{st}$ and $2^{nd}$ nanosheet stacks 101A and 102A is not limited thereto. According to an embodiment, the $1^{st}$ sacrificial nanosheet layers 110S and the $1^{st}$ nanosheet layers 110A may be formed by epitaxially growing one layer and then another until a desired number of the sacrificial nanosheet layers 110S and the nanosheet layers 110A are alternatingly stacked. In the same manner, the $2^{nd}$ sacrificial nanosheet layers 120S and the $2^{nd}$ nanosheet layers 120A may be formed to build the $2^{nd}$ nanosheet stack 102A. According to an embodiment, the number of nanosheet layers and the number of sacrificial nanosheet layers of the $1^{st}$ nanosheet stack 101A may differ from those of the $2^{nd}$ nanosheet stack 102A.

The $1^{st}$ and $2^{nd}$ nanosheet stacks 101A and 102A are respectively enclosed by $1^{st}$ and $2^{nd}$ dummy gates 115D and 125D, which are termed as such because they are to be replaced with real gate structures in a later step.

The $1^{st}$ dummy gate 115D is formed, for example, by lithography and etching, on the $1^{st}$ nanosheet stack 101A to cover all side surfaces of the $1^{st}$ nanosheet stack 101A formed below the $2^{nd}$ nanosheet stack 102A. Specifically, the $1^{st}$ dummy gate 115D is formed to enclose the isolation layer 131 formed on all side surfaces of the $1^{st}$ nanosheet stack 101A. Next, the $2^{nd}$ dummy gate 125D is formed on the $1^{st}$ dummy gate 115D, for example, also by lithography and etching, to cover not only all side surfaces but also a top of the $2^{nd}$ nanosheet stack 102A. Specifically, the $2^{nd}$ dummy gate 125D encloses the isolation layer 131 formed on all side surfaces and top surface of the $2^{nd}$ nanosheet stack 102A.

The $1^{st}$ dummy gate 115D may include amorphous silicon (a-Si) or polycrystalline silicon (poly-Si), and the $2^{nd}$ dummy gate 125D may include the same or different a-SI or poly-Si.

On the substrate 105, shallow trench isolation (STI) regions 106 are formed to isolate the multi-stack nanosheet structure 200 from adjacent multi-stack nanosheet structures or other circuit elements. The STI regions 106 may be formed of silicon oxide ($SiO_x$), the isolation layer 131 may also be formed of $SiO_x$ the same as or different from the STI regions 106, the $1^{st}$ and $2^{nd}$ sacrificial nanosheet layers 110S and 120S, may be formed of silicon-germanium (SiGe), and the $1^{st}$ and $2^{nd}$ nanosheet layers may be formed of Si. The sacrificial nanosheet layers may be SiGe 35%, which indicates that the SiGe compound consists of 35% of Ge and 65% of Si, according to an embodiment.

Referring to FIG. 3B, the $1^{st}$ and $3^{rd}$ source/drain regions 111 and 113 are formed with a sacrificial layer 141S and an interlayer dielectric (ILD) layer 141 therearound, respectively. The $1^{st}$ and $3^{rd}$ source/drain regions 111 and 113 are epitaxially grown from the $1^{st}$ and $2^{nd}$ nanosheet layers 110 and 120, respectively.

The ILD layer 141 may be formed by depositing an oxide material in bulk such as $SiO_2$ having a low-k dielectric. The sacrificial layer 141S may be formed of an oxide material such as aluminum oxide $Al_2O_3$ or lanthanum oxide (LaO) to facilitate wet etching thereon to form a source/drain contact structure to be described later.

FIG. 3B further shows that another isolation layer 132 is formed between the $1^{st}$ and $3^{rd}$ source/drain regions to isolate the two source/drain regions from each other.

FIGS. 4A and 4B illustrate two cross-sectionals views of a multi-stack nanosheet structure included in an array of a plurality of initial multi-stack nanosheet structures on which gate-cut patterning is performed, according to an embodiment.

Referring to FIG. 4B, a gate-cut patterning is performed on the array including the multi-stack nanosheet structure 200 shown in FIG. 4A. The gate-cut patterning is performed by dry etching, wet etching or a combination thereof along a line (not shown) where the dam structure 150 shown in FIG. 2 is formed in a later step. FIGS. 4A and 4B both show that a trench H is formed on both sides of the multi-stack nanosheet structure 200 where the dam structure 150 will be formed.

Figure 5A:
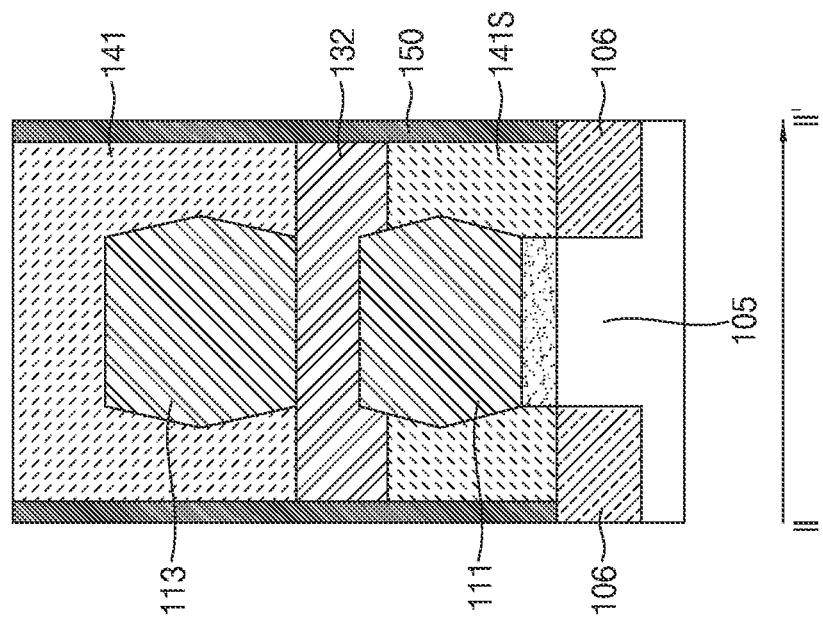
Figure 5B:
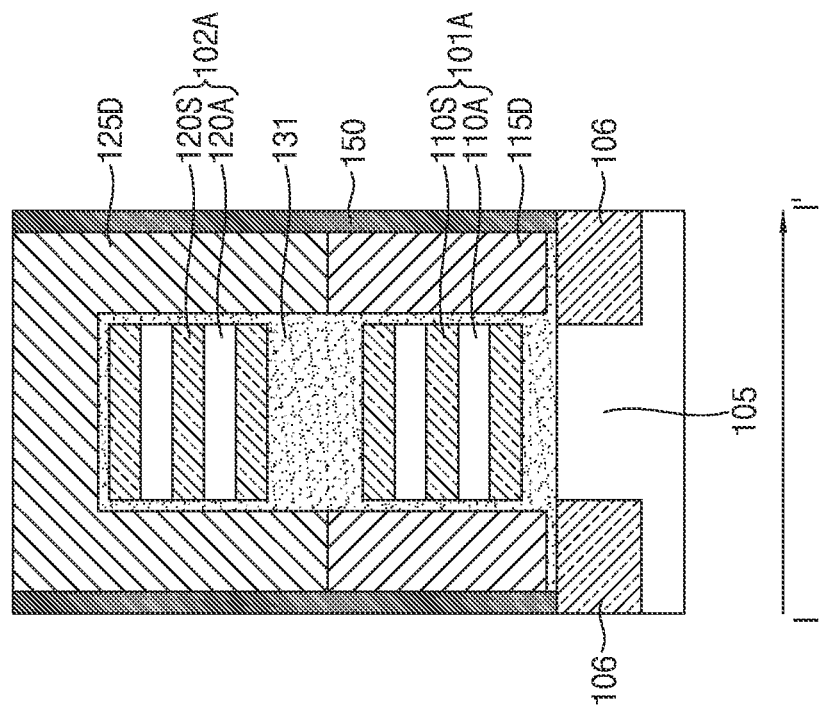

FIGS. 5A and 5B illustrate that a trench formed in a step of FIGS. 4A and 4B is filled with a dam structure, according to an embodiment.

Referring to FIGS. 5A and 5B, the trench H formed in the array including the multi-stack nanosheet structure 100 in the previous step is filled with the dam structure 150 to electrically isolate the multi-stack nanosheet structure 200 from adjacent multi-stack nanosheet structures in the column direction before one or more of the multi-stack nanosheet structures in the array are cut for individual purposes. The dam structure may be formed of a low-k dielectric material such as SiO, SiN or $SiO_xN_y$.

FIGS. 6A and 6B illustrate a multi-stack nanosheet structure in which dummy gates are removed, and instead, replacement metal gates are formed, according to an embodiment.

Referring to FIGS. 6A and 6B, the $1^{st}$ and $2^{nd}$ dummy gates 115D and 125D are removed along with the $1^{st}$ and $2^{nd}$ sacrificial nanosheet layers 110S and 120S, and the isolation layer 131 formed on the top surface of the $2^{nd}$ nanosheet stack 102A and side surfaces of the $1^{st}$ and $2^{nd}$ nanosheet stacks 101A and 102A except a portion 131R of the isolation layer 131 formed between the substrate 105 and the $1^{st}$ nanosheet stack 101A. This removal operation may be performed by dry etching, wet etching, reactive ion etching (RIE) and/or a chemical oxide removal (COR) process.

Next, a space generated by the foregoing removal operation is filled with $1^{st}$ and $2^{nd}$ replacement metal gates 115 and 125 which constitute the gate structures 115 and 125, respectively, shown in FIG. 1B. When the $1^{st}$ and $2^{nd}$ replacement metal gates 115 and 125 are filled in the space, a combination layer 116 of a hafnium (Hf) based high-k dielectric layer and a work function metal layer of Titanium (Ti), Tantalum (Ta) or their compound may be first deposited, and then, a conductor metal such as tungsten or aluminum may be deposited to form the $1^{st}$ and $2^{nd}$ replacement metal gates 115 and 125 by, for example, chemical vapor deposition (CVD) or flowable CVD (FCVD) which is well known in the art. The $1^{st}$ and $2^{nd}$ replacement metal gates 115 and 125 may be distinguished from each other in terms of the materials and characteristics of the work function metal layer of the combination layer 116, depending on a type of transistor structure to be built from the $1^{st}$ and $2^{nd}$ replacement metal gates 115 and 125. Detailed techniques for forming the $1^{st}$ and $2^{nd}$ replacement metal gates 115 and 125 are well known in the art, thus, omitted herein.

FIG. 6A also shows that the gate contact structure 126 is formed on the $2^{nd}$ replacement metal gate 125 receiving a gate input signal for at least the $2^{nd}$ replacement metal gate 125. The gate contact structure 126 may be formed of the same material forming the $1^{st}$ to $4^{th}$ source/drain contact structures 121 to 124.

FIGS. 7A and 7B illustrate that an ILD layer surrounding a source/drain region is patterned in a multi-stack nanosheet structure, according to an embodiment.

Referring to FIG. 7B, the ILD layer 141 formed around the $3^{rd}$ source/drain region 113 is patterned, for example, by dry etching to obtain an opening S1 for forming the $3^{rd}$ source/drain contact structure 123. The ILD layer 141 is further patterned, for example, by dry etching and wet etching to obtain an opening S2 for forming the $1^{st}$ source/drain contact structure 121 in a later step. The opening S2 is extended through the isolation layer 132 and the sacrificial layer 141S to expose a side surface of the $1^{st}$ source/drain region 111.

Here, due to the dam structure 150 formed at a side of the multi-stack nanosheet structure 200 according to an embodiment, etchant such as a mixture of hydrofluoric acid, nitric acid, and acetic acid for wet etching through the sacrificial layer 141S cannot spread into a region of an adjacent multi-stack nanosheet structure in the array of the multi-stack nanosheet structures.

In the meantime, the dam structure 150 is formed in the earlier step described in reference to FIGS. 5A and 5B before the $1^{st}$ and $2^{nd}$ replacement metal gates 115 and 125 are formed to prevent an electrical short circuit between the multi-stack nanosheet structure 200 and adjacent multi-stack nanosheet structures in the column direction. However, according to embodiments, the dam structure 150 may be formed any time before the wet etching operation is performed to provide the opening S2 for the $1^{st}$ source/drain contact structure 121 in the current step.

Figure 8A:
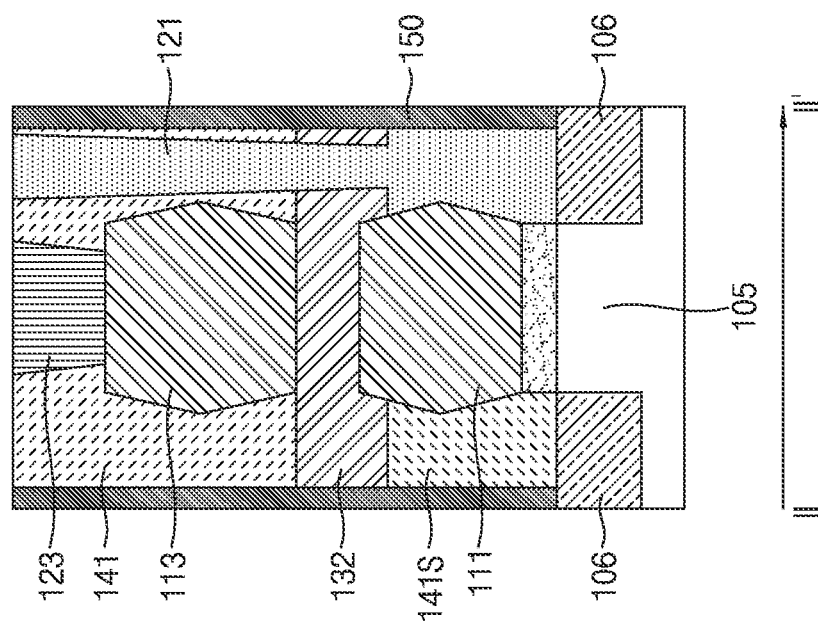
Figure 8B:
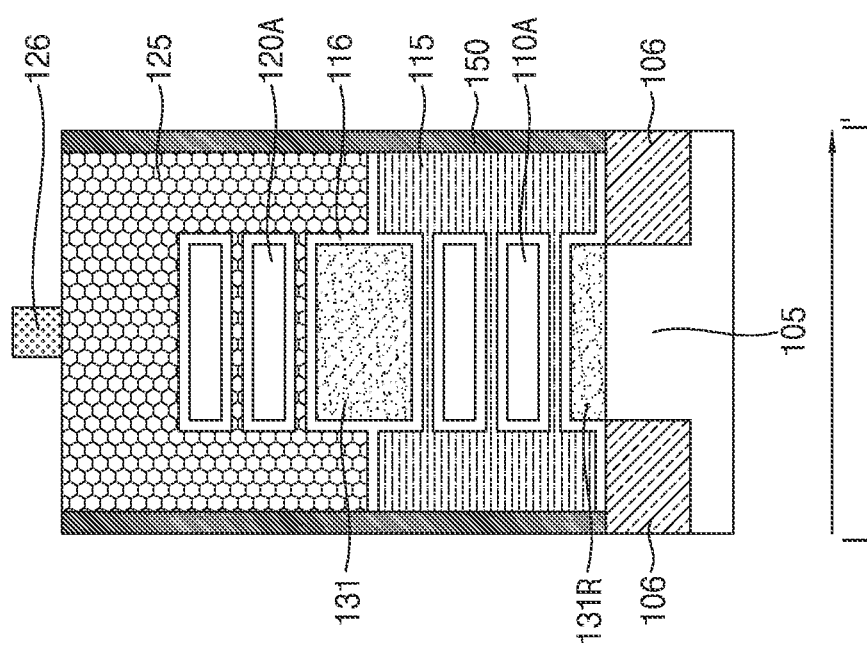

FIGS. 8A and 8B illustrate that source/drain contact structures are formed in a multi-stack nanosheet structure.

Referring to FIG. 8B, the $1^{st}$ and $3^{rd}$ source/drain contact structures 121 and 123 are formed in the spaces S2 and Si obtained in the previous step, respectively, to complete the multi-stack nanosheet structure 200 as the multi-stack nanosheet structure 100 shown in FIG. 2.

It is understood here that the $2^{nd}$ and $4^{th}$ source/drain contact structures 122 and 124 of the $1^{st}$ and $2^{nd}$ nanosheet stacks 101A and 102A may also be formed in a same or similar manner as the $1^{st}$ and $3^{rd}$ source/drain contact structures with respect to the $1^{st}$ and $2^{nd}$ nanosheet stacks 101A and 102A, respectively.

In the above embodiments, a dam structure such as the dam structure 150 is formed between rows of an array of multi-stack nanosheet structures to electrically isolate multi-stack nanosheet structures in a same row from multi-stack nanosheet structures in adjacent tows in a column direction. However, the inventive concept is not limited thereto. According to an embodiment, the dam structure 150 may be extended to isolate multi-stack nanosheet structures between columns as well as rows of an array of the multi-stack nanosheet structures.

FIG. 9 illustrates a top plan view of an array of multi-stack nanosheet structures divided by row and column, according to an embodiment.

An array of multi-stack nanosheet structures 20 shown in FIG. 9 includes a plurality of multi-stack nanosheet structures divided in $1^{st}$ to $3^{rd}$ columns C1 to C3 as well as $1^{st}$ to $3^{rd}$ rows R1 to R3 by a dam structure 250, which is an extended form of the dam structure 150 shown in FIG. 2, according to an embodiment. Each of the multi-stack nanosheet structures in the array 20 has a same structure as the multi-stack nanosheet structure 100 shown in FIGS. 1B and 2, and thus, duplicate descriptions may not be provided herebelow.

In addition to the difference of the dam structure 250 from the dam structure 150, the array 20 is different from the array 10 of FIG. 2 in that a multi-stack nanosheet structure included in the array 20 does not share any of the source/drain regions and any of the source/drain contact structures with an adjacent multi-stack nanosheet structure in the row direction. For example, the multi-stack nanosheet structure 100 in the $2^{nd}$ row R2 and the $2^{nd}$ column C2 does not share its source/drain regions with the adjacent multi-stack nanosheet structure 200 or 300 in the same row, unlike the multi-stack nanosheet structure 200 in the same position in the array 10 of FIG. 2. This is a reason for the array 20 to have the dam structure 250 which extends the dam structure 150 between columns. Due to the dam structure 250, electrical short pass may be prevented even between two adjacent multi-stack nanosheet structures in the column direction, for example, between the multi-stack nanosheet structures 100 and 200.

A method of manufacturing the array 20 may be similar to that of manufacturing the array 10 described above in reference to FIGS. 3A and 3B to FIGS. 8A and 8B, and thus, duplicate descriptions will be omitted herein.

However, the method of manufacturing the array 20 requires a step of fin-cut patterning in the column direction as opposed to the gate-cut patterning in the row direction. This fin-cut patterning may be performed at the time of the gate-cut patterning so that the dam structure 250 is formed as shown in FIG. 9.

Thus far, the inventive concept has been described with respect to manufacturing an array of a plurality of multi-stack nanosheet structures. However, the inventive concept is not limited thereto, and instead, may apply to manufacturing an array of a plurality of different types of multi-stack transistor structures such as multi-stack planar transistor structures, multi-stack finFET structures, and a hybrid multi-stack transistor structure including one or more of a planar transistor structure, a finFET structure, and a nanosheet structure, according to embodiments.

Figure 10:
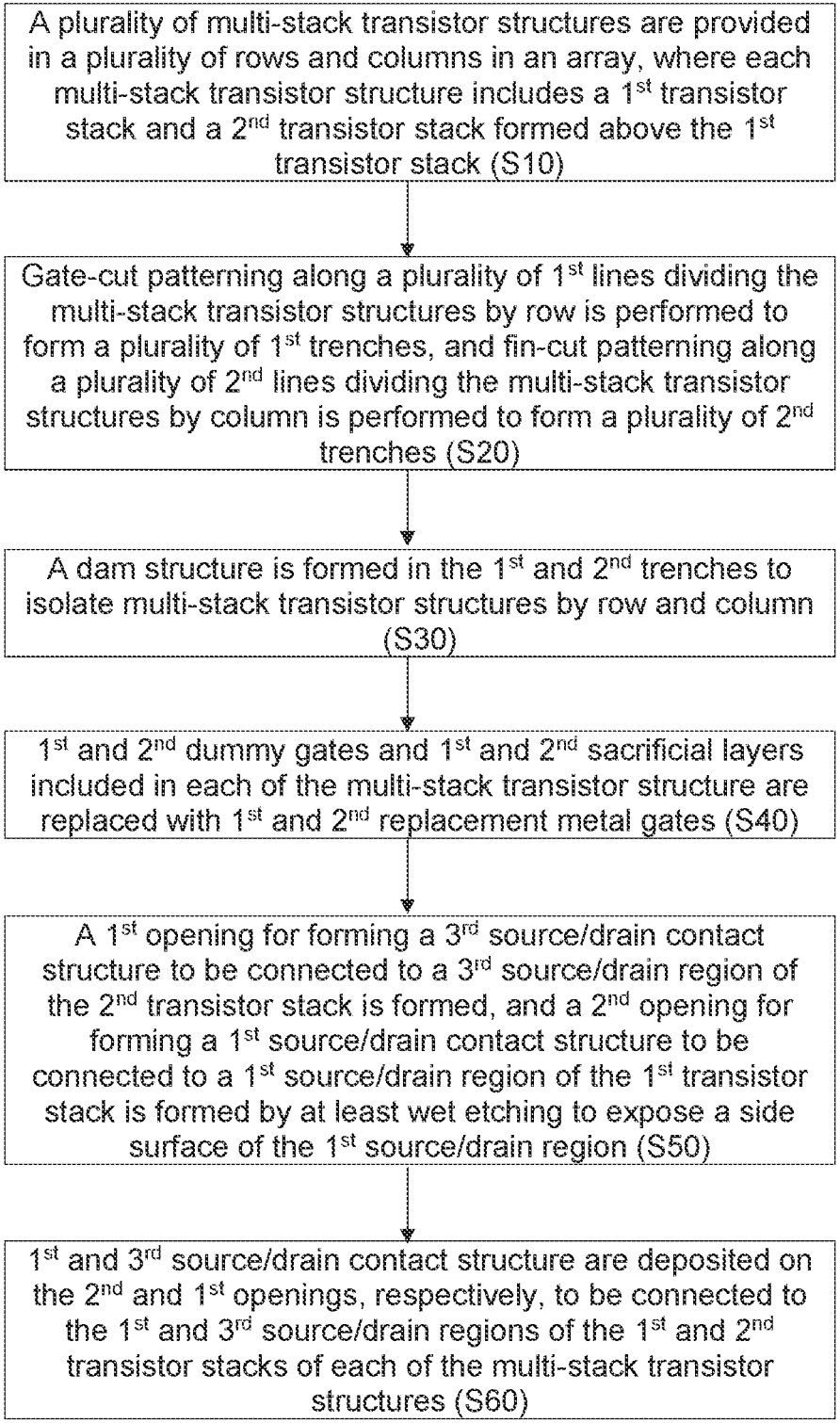
FIG. 10 illustrates a flowchart describing a method of manufacturing an array of multi-stack nanosheet structures, according to embodiments.

FIG. 10 illustrates a flowchart describing a method of manufacturing an array of multi-stack transistor structures not being limited to the above-exemplified nanosheet structures, according to embodiments.

In operation S10, a plurality of multi-stack transistor structures arranged in a plurality of rows and columns are provided in an array, where each of the multi-stack transistor structures includes a $1^{st}$ transistor stack and a $2^{nd}$ transistor stack formed above the $1^{st}$ transistor stack (see, e.g., FIGS. 1B, 3A-3B and 9). At this time, the array of multi-stack transistor structures may be formed on a substrate, and the $1^{st}$ and $2^{nd}$ transistor stacks are respectively enclosed by $1^{st}$ and $2^{nd}$ dummy gates. The $1^{st}$ and $2^{nd}$ transistor stacks may include a plurality of $1^{st}$ channel layers and a plurality $2^{nd}$ channel layers, respectively, such as nanosheet layers for a nanosheet stack, and fin structures for a finFET stack. Further, the $1^{st}$ transistor stack may include $1^{st}$ and $2^{nd}$ source/drain regions, and the $2^{nd}$ transistor stack may include $3^{rd}$ and $4^{th}$ source/drain regions vertically overlapping the $1^{st}$ and $2^{nd}$ source/drain regions, respectively.

In operations S20, gate-cut patterning along a plurality of $1^{st}$ lines dividing the multi-stack transistor structures by row is performed to form a plurality of $1^{st}$ trenches, and also, fin-cut patterning along a plurality of $2^{nd}$ lines dividing the multi-stack transistor structures by column is performed to form a plurality of $2^{nd}$ trenches (see, e.g., FIGS. 4A-4B and 9).

In operation S30, a dam structure is formed in the $1^{st}$ and $2^{nd}$ trenches to isolate multi-stack transistor structures by row and column (see, e.g., FIGS. 3, 5A-5B and 9). The dam structure may be formed of a low-k dielectric material such as SiO, SiN or $SiO_xN_y$.

In operation S40, the $1^{st}$ and $2^{nd}$ dummy gates respectively enclosing the $1^{st}$ and $2^{nd}$ transistor stacks are removed and replaced with $1^{st}$ and $2^{nd}$ replacement metal gates, respectively (see, e.g., FIGS. 6A-6B and 9).

In operation S50, a $1^{st}$ opening for forming a $3^{rd}$ source/drain contact structure to be connected to the $3^{rd}$ source/drain region of the $2^{nd}$ transistor stack is formed, for example, by dry etching, and a $2^{nd}$ opening for forming a $1^{st}$ source/drain contact structure to be connected to the $1^{st}$ source/drain region of the $1^{st}$ transistor stack is formed, for example, by at least wet etching, to open a side surface of the $1^{st}$ source/drain region for connection with the $1^{st}$ source/drain contact structure, with respect to each of the multi-stack transistor structures (see, e.g., FIGS. 7A-7B and 9). The $2^{nd}$ opening may also expose the dam structure. At this time, due to the dam structure formed in the earlier step, etchant such as a mixture of hydrofluoric acid, nitric acid, and acetic acid for wet etching cannot spread into a region of an adjacent multi-stack transistor structure in the array of the multi-stack transistor structures.

In operation S60, the $1^{st}$ and $3^{rd}$ source/drain contact structure are formed on the $2^{nd}$ and $1^{st}$ openings, respectively, formed in the previous stop to be connected to the $1^{st}$ and $3^{rd}$ source/drain regions of the $1^{st}$ and $2^{nd}$ transistor stacks of each of the multi-stack transistor structures (see, e.g., FIGS. 8A-8B and 9).

The foregoing method described in reference to FIG. 10 may apply to manufacturing of an array of multi-stack transistor structures divided by row and column (see, e.g., the array 20 in FIG. 9). However, this method may also apply to manufacturing of an array of multi-stack transistor structures divided by row (see, e.g. the array 10 in FIG. 2), when each of the multi-stack transistor structures included in the array is configured to share its $1^{st}$ and $3^{rd}$ source/drain regions and corresponding $1^{st}$ and $3^{rd}$ source/drain contact structure with an adjacent multi-stack transistor structure in a same row, and the fin-cut patterning and depositing the dam structure in the $2^{nd}$ trenches are omitted in operation S20.

When the foregoing method described in reference to FIG. 10 applies only to the array of multi-stack transistor structures divided by row like the array 10 shown in FIG. 2, the dam structure may be formed in the $1^{st}$ trenches to divide all adjacent rows in the array so that multi-stack transistor structures in any one row are electrically isolated from multi-stack transistor structures in any adjacent row. In this case, each of the multi-stack transistor structures shares at least one of the $1^{st}$ to $4^{th}$ source/drain region and at least one of the $1^{st}$ to $4^{th}$ source/drain contact structures with an adjacent multi-stack transistor device in a same row. Further, except the left-most and right-most multi-stack transistor devices in the same row, each of the multi-stack transistor devices in the same row may share the $1^{st}$ and $3^{rd}$ source/drain regions and the $1^{st}$ and $3^{rd}$ source/drain contact structures with a multi-stack transistor device disposed on its left in the same row, and share the $2^{nd}$ and $4^{th}$ source/drain regions and the $2^{nd}$ and $4^{th}$ source/drain contact structures with a multi-stack transistor device disposed on its right.

In contrast, when the foregoing method applies only to the array of multi-stack transistor structures divided by row and column like the array 20 shown in FIG. 9, the dam structure may be formed in the $2^{nd}$ trenches as well as the $1^{st}$ trenches to divide all adjacent rows and all adjacent columns in the array so that multi-stack transistor structures in any one row are electrically isolated from multi-stack transistor structures in any adjacent row, and further, multi-stack transistor structures in any one column are electrically isolated from multi-stack transistor structures in any adjacent column. In this case, no multi-stack transistor structure shares any of the $1^{st}$ to $4^{th}$ source/drain regions and any of the $1^{st}$ to $4^{th}$ source/drain contact structures with any adjacent multi-stack transistor structure in a same row or column.

According to the above-descried methods of manufacturing an array of multi-stack transistor structures, an electrical short pass between adjacent multi-stack transistor structures in the array may be prevented by forming a dielectric dam structure in a gate-cut patterning step prior to a step of forming source/drain contact structures for lower transistor stacks, and further, it is unnecessary to perform a later patterning and molding process for individual gate cutting after the multi-stack transistor structures are finished as multi-stack transistor transistors.

Figure 11:
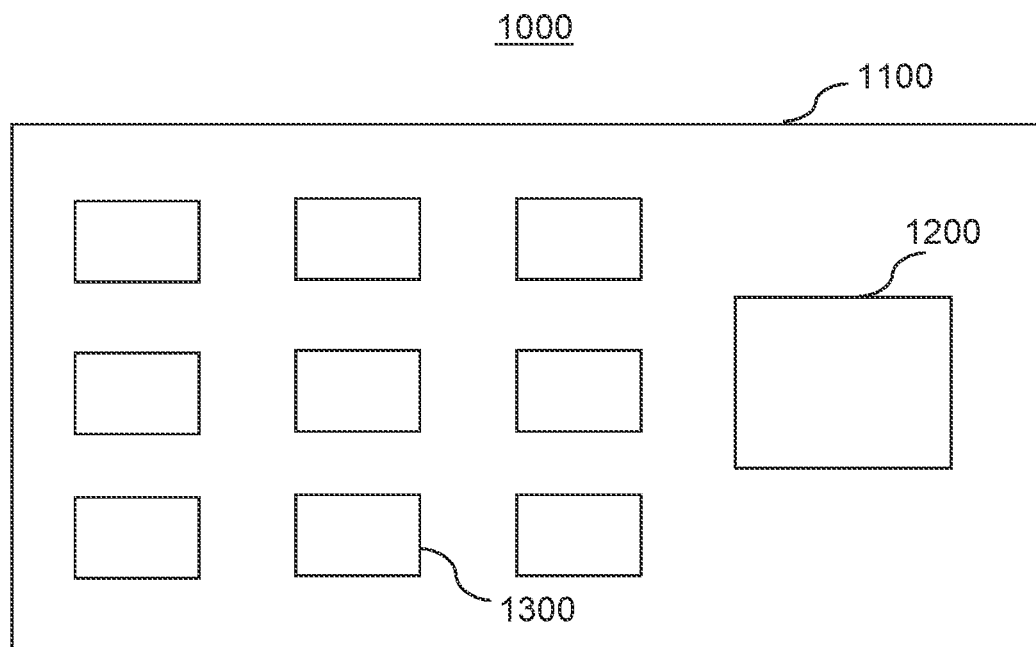
FIG. 11 illustrates a schematic plan view of a semiconductor module according to an embodiment.

FIG. 11 illustrates a schematic plan view of a semiconductor module according to an embodiment.

Referring to FIG. 11, a semiconductor module 1000 according to an embodiment may include a processor 1200 and semiconductor devices 1300 that are mounted on a module substrate 1100. The processor 1200 and/or the semiconductor devices 1300 may include one or more multi-stack transistor structures described in the above embodiments.

Figure 12:
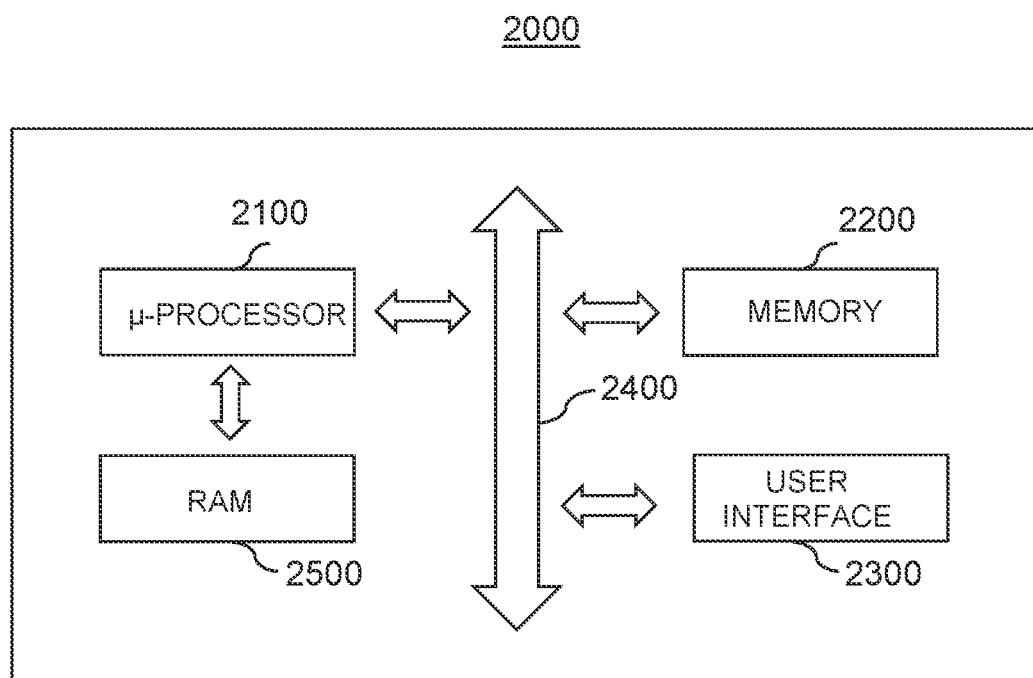
FIG. 12 illustrates a schematic block diagram of an electronic system according to an embodiment.

FIG. 12 illustrates a schematic block diagram of an electronic system according to an embodiment.

Referring to FIG. 12, an electronic system 2000 in accordance with an embodiment may include a microprocessor 2100, a memory 2200, and a user interface 2300 that perform data communication using a bus 2400. The microprocessor 2100 may include a central processing unit (CPU) or an application processor (AP). The electronic system 2000 may further include a random access memory (RAM) 2500 in direct communication with the microprocessor 2100. The microprocessor 2100 and/or the RAM 2500 may be implemented in a single module or package. The user interface 2300 may be used to input data to the electronic system 2000, or output data from the electronic system 2000. For example, the user interface 2300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 2200 may store operational codes of the microprocessor 2100, data processed by the microprocessor 2100, or data received from an external device. The memory 2200 may include a memory controller, a hard disk, or a solid state drive (SSD).

At least the microprocessor 2100, the memory 2200 and/or the RAM 2500 in the electronic system 2000 may include one or more multi-stack transistor structures described in the above embodiments.

The foregoing is illustrative of exemplary embodiments and is not to be construed as limiting thereof. For example, one or more steps described above for manufacturing an array of multi-stack transistor structure may be omitted to simplify the process. Although a few exemplary embodiments have been described, those skilled in the art will readily appreciate that many modifications are possible in the above embodiments without materially departing from the inventive concept.

What is claimed is:

1. An array of multi-stack transistor structures,
   wherein the multi-stack transistor structures are arranged in a plurality of rows and a plurality of columns in the array,
   wherein each of the multi-stack transistor structures comprises two or more vertically arranged transistor stacks, and
   wherein a dam structure is formed between adjacent two rows in a same column so that a multi-stack transistor structure in one of the adjacent two rows is electrically isolated from a multi-stack transistor structure in the other of the adjacent two rows in the same column.

2. The array of multi-stack transistor structures of claim 1, wherein each of the multi-stack transistor structures comprises:
   a 1st transistor stack comprising $1^{st}$ and $2^{nd}$ source/drain regions;
   a 2nd transistor stack formed above the $1^{st}$ transistor stack, and comprising $3^{rd}$ and $4^{th}$ source/drain regions vertically overlapping the $1^{st}$ and $2^{nd}$ source/drain regions, respectively;

1st and 2nd source/drain contact structures landing on side surfaces of the 1st and 2nd source/drain regions, respectively; and 3rd and 4th source/drain contact structures landing on top surfaces of the 3rd and 4th source/drain regions, respectively.

3. The array of multi-stack transistor structures of claim 2, wherein at least one of the 1st and 2nd source/drain contact structures of at least one of the multi-stack transistor structures in each row contacts the dam structure, and
wherein none of the 3rd and 4th source/drain contact structures in each row contacts the dam structure.

4. The array of multi-stack transistor structures of claim 3, wherein at least one of the multi-stack transistor structures shares at least one of the 1st to 4th source/drain region and at least one of the 1st to 4th source/drain contact structures with an adjacent multi-stack transistor structure in a same row.

5. The array of multi-stack transistor structures of claim 4, wherein, except the left-most and right-most multi-stack transistor structures in the same row, at least one of the multi-stack transistor structures in the same row shares the 1st and 3rd source/drain regions and the 1st and 3rd source/drain contact structures with a multi-stack transistor structure disposed on its left in the same row, and shares the 2nd and 4th source/drain regions and the 2nd and 4th source/drain contact structures with a multi-stack transistor structure disposed on its right.

6. The array of multi-stack transistor structures of claim 2, wherein the multi-stack transistor structures in the same row are arranged in a channel length direction, and
wherein at least two of the multi-stack transistor structures in the same row share a same fin region where the 1st to 4th source/drain regions and the 3rd and 4th source/drain contact structure of the at least two multi-stack transistor structures are disposed in a plan view of the array.

7. The array of multi-stack transistor structures of claim 6, wherein the multi-stack transistor structures in a same column are arranged in a channel width direction, and shares a same gate structure divided by the dam structure in the plan view of the array.

8. An array of multi-stack transistor structures,
wherein the multi-stack transistor structures are arranged in a plurality of rows and a plurality of columns in the array,
wherein each of the multi-stack transistor structures comprises two or more vertically arranged transistor stacks, and
wherein a dam structure is formed between adjacent two rows in a same column and adjacent two columns in a same row so that a multi-stack transistor structure in one of the adjacent two rows is electrically isolated from a multi-stack transistor structures in the other of the adjacent two rows in the same column, and a multi-stack transistor structure in one of the adjacent two columns is electrically isolated from a multi-stack transistor structure in another of the adjacent two columns in the same row.

9. The array of multi-stack transistor structures of claim 8, wherein each of the multi-stack transistor structures comprises:

a 1st transistor stack comprising 1st and 2nd source/drain regions;

a 2nd transistor stack formed above the 1st transistor structure, and comprising 3rd and 4th source/drain regions vertically overlapping the 1st and 2nd source/drain regions, respectively;

1st and 2nd source/drain contact structures landing on side surfaces of the 1st and 2nd source/drain regions, respectively; and 3rd and 4th source/drain contact structures landing on top surfaces of the 3rd and 4th source/drain regions, respectively.

* * * * *